(12) United States Patent
Pritchard et al.

(10) Patent No.: US 7,036,107 B1
(45) Date of Patent: Apr. 25, 2006

(54) METHODS AND APPARATUS FOR SELECTIVE COMMENT ASSERTION

(75) Inventors: Jeffrey Orion Pritchard, Santa Cruz, CA (US); Tim Allen, Santa Cruz, CA (US); Aaron Ferrucci, Santa Cruz, CA (US); Chris Adler, Watsonville, CA (US)

(73) Assignee: Altera Corporation, San Jose, CA (US)

( * ) Notice: Subject to any disclaimer, the term of this patent is extended or adjusted under 35 U.S.C. 154(b) by 328 days.

(21) Appl. No.: 10/461,742

(22) Filed: Jun. 12, 2003

(51) Int. Cl.
*G06F 17/50* (2006.01)

(52) U.S. Cl. .............................. 716/18; 716/4; 703/13

(58) Field of Classification Search .................... 716/1, 716/4, 18; 703/13
See application file for complete search history.

(56) References Cited

U.S. PATENT DOCUMENTS 6,519,756 B1 * 2/2003 Kao et al. .................... 716/18
6,836,877 B1 * 12/2004 Dupenloup ................. 716/18

OTHER PUBLICATIONS

Van De Vanter, "Preserving the Documentary Structure of Source Code in Language-based Transformation Tools," 2001 First IEEE Int'l Workshop on Source Code Analysis and Manipulation, pp. 131-141.*
Some et al., "Parsing Minimization when Extracting Information from Code in the Presence of Conditional Compilation," 1998 6th Int'l Workshop on Program Comprehension, pp. 118-125.*
Bening et al., "Optimizing Multiple EDA Tools within the ASIC Design Flow," IEEE Design & Test of Computers, pp. 46-55.*
Exemplar Logic, Inc. "Leonardo Spectrum for Altera Reference Manual, Software Version v2001.1", copyright 2001 Exemplar Logic, Inc. Jul. 2001.
Synplify, Inc., Synplify Reference Manual, Oct. 2001.

* cited by examiner

*Primary Examiner*—Leigh M. Garbowski
(74) *Attorney, Agent, or Firm*—Beyer, Weaver & Thomas, LLP.

(57) ABSTRACT

Methods and apparatus are provided for efficiently implementing a programmable chip using hardware description source files passed through multiple tools. A hardware description language source file is provided with mechanisms to allow tool-specific code to be handled by both a synthesis tool and by a simulation tool. Instructions are provided to direct a synthesis tool to read as code comments that a simulation tool is configured to disregard.

31 Claims, 7 Drawing Sheets

| Comment Indicator 501 | Vendor Code 505 | Instruction (Exception) 503 |
|---|---|---|
| Comment Indicator 511 | Synthesis Tool Specific Code 513 | |
| Comment Indicator | Vendor Code 525 | End Instruction (Exception) |

Figure 4
"Prior Art"

| Comment Indicator 401 | Vendor Code 405 | Instruction |
|---|---|---|
| Simulation Tool Specific Code | | |
| Comment Indicator 421 | Vendor Code 425 | End Instruction 423 |

Figure 5

| Comment Indicator 501 | Vendor Code 505 | Instruction (Exception) 503 |
|---|---|---|
| Comment Indicator 511 | Synthesis Tool Specific Code 513 | |
| Comment Indicator | Vendor Code 525 | End Instruction (Exception) |

METHODS AND APPARATUS FOR SELECTIVE COMMENT ASSERTION

BACKGROUND OF THE INVENTION

1. Field of the Invention

The present invention relates to implementing programmable chips. More specifically, the present invention relates to methods and apparatus for enabling the efficient and optimized implementation of programmable chips using hardware description language source files passed through multiple tools.

2. Description of the Prior Art

Logic designers traditionally process designs represented as hardware description language source files using a variety of different tools. In one example, designs are simulated using one tool and synthesized using another tool. In many instances, the various tools are provided by different vendors. Many of the tools support and recognize the general syntax and constructs in hardware description language code.

However, some tool-specific portions of code are sometimes used during logic design. A synthesis tool provider may support tool-specific syntax and constructs that extend the features and functionality of the hardware description language for that particular tool. However, the tool-specific syntax and constructs may not be supported by other tools. For example, a synthesis tool-specific portion of code may not be recognizable by a simulation tool. Conversely, a simulation tool-specific portion of code may not be recognizable by a synthesis tool. Few mechanisms are available for allowing tool-specific code to be handled by multiple tools often from different vendors. Consequently, it is therefore desirable to provide improved methods and apparatus for handling tool-specific code.

SUMMARY OF THE INVENTION

Methods and apparatus are provided for efficiently implementing a programmable chip using hardware description source files passed through multiple tools. A hardware description language source file is provided with mechanisms to allow tool-specific code to be handled by both a synthesis tool and by a simulation tool. Instructions are provided to direct a synthesis tool to read as code comments that a simulation tool is configured to disregard.

In one aspect, a method for parsing code is provided. A source file is received at a logic synthesis tool. A scan of the source file is initiated. The source file includes logic information for implementing a programmable chip. Comment indicator information included in the source file is identified. The comment indicator information directs the logic synthesis tool to disregard a first portion of the source file as comment information. Exception indicator information included in the first portion is identified. The exception indicator directs that a second portion of the source file included in the first portion is not comment information. The second portion is parsed.

In another aspect, a computer readable medium including computer code for implementing a programmable chip is provided. The computer readable medium includes comment indicator information, exception indicator information, and logic description information. The comment indicator information directs a logic synthesis tool to disregard a first portion of a source file associated with the computer readable medium as comment information. The exception indicator information included in the first portion directs that a second portion of the source file included in the first portion is not comment information. The logic description information included in the second portion provides information on implementing the programmable chip.

In yet another aspect, a system for implementing a programmable chip is provided. The system includes an interface, a memory, and a processor. The interface is configured to receive a source file including logic information for implementing a programmable chip. The processor is coupled to memory. The processor is configured to initiate a scan of the source file and identify comment indicator information and exception indicator information. The comment indicator information designates a first portion of the source file as comment information and the exception indicator information included in the first portion designates that a second portion of the source file is not comment information.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

FIG. 4 is a diagrammatic representation showing a mechanism for handling simulation tool-specific code.

FIG. 5 is a diagrammatic representation showing a mechanism for handling synthesis tool-specific code.

DETAILED DESCRIPTION OF SPECIFIC EMBODIMENTS

Figure 1:
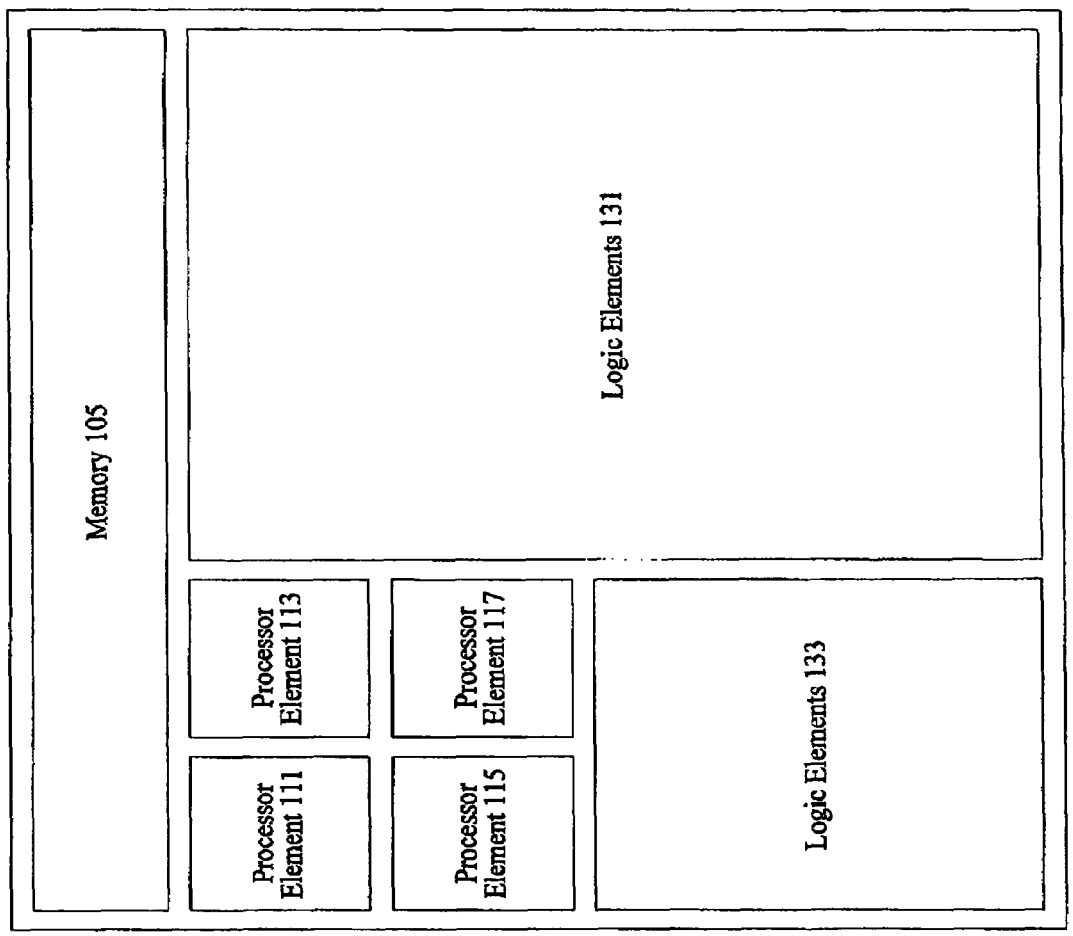
FIG. 1 is a diagrammatic representation showing a device that can be the target of the techniques of the present invention.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. For example, the techniques of the present invention will be described in the context of particular tools for logic synthesis and simulation. However, it should be noted that the techniques of the present invention can be applied to a variety of tools and associated code provided to the tools. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Conventional programmable chips include logic that can be customized for specific applications based on the needs of a particular user. Examples of programmable chips include programmable logic devices (PLDs) and field programmable gate arrays (FPGAs). Programmable chips offer advantages over more specialized application-specific integrated circuits (ASICs), such as significant cost savings in non-mass market applications. ASICs are custom-designed integrated circuits for specific usages. Because ASICs are custom-designed, they are often faster compared to programmable chips. However, the process of designing, verifying, fabricating, and testing ASICs is time-consuming and expensive. Any flaw uncovered on a particular ASIC after fabrication is complete requires a vast amount of time and expense to correct. Furthermore, ASICs are not programmable. An ASIC fabricated for specific digital signal processing (DSP) applications can not be reconfigured if the specific applications change.

In many implementations, logic designers create a logic description of a design using a hardware description language (HDL) such as VHDL or Verilog. Hardware description languages allow the simulation and synthesis of logic designs. In typical implementations, the same hardware description language code is passed to both the simulation tool and the synthesis tool in order to ensure integrity of the design verification.

Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded. Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif.

Tools for synthesis allow the implementation of the logic design on a programmable chip. Some of the available synthesis tools are Leonardo Spectrum, available from Mentor Graphics Corporation of Wilsonville, Oreg. and Synplify available from Synplicity Corporation of Sunnyvale, Calif. In many instances, the simulation and synthesis tools are capable of understanding most hardware description language code. However, problems arise when portions of HDL code can only be understood by either the simulation tool or the synthesis tool. In one example, more than 90% of the code can be read and understood by both a simulation tool and by a synthesis tool. However, there may be some blocks of code meant only for the simulation tool and some other blocks meant only for the synthesis tool.

For example, synthesis tools may understand technology specific constructs such as memory objects (e.g. RAM or ROM functions) and know how to build a design which includes them directly. Some examples of RAM or ROM functions supported by synthesis tools include library or parameterized modules (LPM), such as lpm_ram_dq, lpm_ram_io, lpm_rom, as well as cycle-shared dual port RAM (csdpram), dual-port RAM (altdpram), single-Clock FIFO (scfifo), and dual-clock FIFO (dcfifo) functions. However, a simulation tool may not understand these particular constructs. In many instances, simulator tools have no prior knowledge of technology specific constructs and generate errors when exposed to the technology specific elements of a design.

Verilog provides conditional compilation directives in the form of ifdef statements that indicate to a tool such as a compiler whether code should or should not be ignored. High level programming languages such as C also support similar features for software designs. In one example, if a variable such as SIMULATION_TOOL_READABLE is toggled on, a simulation tool would parse and compile Verilog code for simulation. However, if the variable SIMULATION_TOOL_READABLE is toggled off, the simulation tool would ignore the code portion. Another variable such as SYNTHESIS_TOOL_READABLE could be toggled in order to indicate whether an associated code portion should be processed by a synthesis tool. The ifdef statements provide a convenient mechanism for logic designers to write tool-specific code in files passed to multiple tools. Any code that may only be recognizable by some of the tools configured to parse and process the code is referred to herein as tool-specific code. In one example, tool-specific code is hardware description language code for implementing memory objects recognizable by a synthesis tool but not by a simulation tool. Tool-specific code recognizable by a sythesis tool is referred to herein as synthesis tool-specific code. Tool-specific code recognizable by a simulation tool is referred to herein as simulation tool-specific code.

Other hardware description languages such as VHDL, however, do not provide a mechanism similar to the ifdef statement in Verilog. Consequently, there is no convenient mechanism for indicating, for example, that a specific portion of code should be processed by a synthesis tool but ignored by a simulation tool. A wide range of efforts have been invested in allowing tool-specific code in VHDL source files.

One way of allowing tool-specific code in VHDL source files is to use preprocessing scripts. A logic designer prepares a VHDL source file including code portions understandable only by a synthesis tool and code portions understandable only by a simulation tool. A synthesis tool preprocessing script is then run on the VHDL source file to remove or modify the simulation tool portions, creating a synthesis tool-specific VHDL source file. The synthesis tool-specific VHDL source file is then passed to a synthesis tool. In a similar manner, a simulation tool preprocessing script is run on a VHDL source file to remove or modify any synthesis tool portions including technology specific elements, creating a simulation tool-specific VHDL source file. Alternatively, synthesis tool-specific elements are converted into a format that can be understood by a simulation tool or vice versa. The simulation tool-specific VHDL source file is then passed to a simulation tool. The two different preprocessing scripts may output two different tool-specific VHDL source files. Preprocessing scripts, however, are often non-trivial, command prompt driven utilities that are prone to human error. Furthermore, preprocessing scripts potentially add another layer of possible debugging in the design process. Scripts may also have to be customized and rewritten for particular tools.

Simulation models of technology specific constructs are often used in conjunction with preprocessing scripts. Preprocessing scripts with simulation models of technology specific constructs are also often non-trivial, command prompt driven utilities that are prone to human error. In one example, a memory generation utility can be to create simulation models for any supported RAM or ROM function. Instantiations of asynchronous or synchronous RAM or ROM can also be created with the utility. Memory size and memory type may have to be entered to a particular VHDL design component. Many preprocessing scripts and in particular preprocessing scripts providing simulation models require very particular input formats and may only be compatible with a certain set of simulation tools.

A less involved mechanism for allowing tool-specific code to be passed to multiple tools would be to introduce a statement such as ifdef into VHDL. However, there are many vendors and users of VHDL tools, and adding such a feature would require agreement amongst a large number of parties. Furthermore, adding such a feature would also render obsolete a large number of tools currently in existence, as existing tools would not understand the new ifdef analogous statement. Logic designers would then again have to resort to one of the above mechanisms for allowing tool-specific code.

The techniques of the present invention recognize that mechanisms for allowing logic designers to process HDL source files through multiple tool chains are limited. According to various embodiments, the techniques of the present invention allow tool-specific code to be processed by multiple tools in a manner compatible with existing synthesis and simulation tools. In one example, a relatively simple modification to a synthesis tool allows tool-specific code to e passed to both a synthesis and a simulation tool without modification of the simulation tool.

FIG. 1 is a diagrammatic representation of a programmable chip that can be implemented from HDL source files passed though multiple tools. In one example, the heterogeneous programmable chip includes memory 105, logic elements 131 and 133, and processor elements 111, 113, 115, and 117. It should be noted that various components such as processor elements 111, 113, 115, and 117 are optional. The programmable chip does not need these elements incorporated and may have one or more processor cores. Alternatively, a variety of different components can be assembled to form a processor core. Instead of providing a generic processor core on a programmable chip, different components are provided to allow customization of the processor core.

Logic elements 131 typically can be implemented using components such as antifuses, static RAM, and EPROMS. Any mechanism in a programmable chip that performs an operation on a given number of input lines to provide one or more outputs based on information programmed is herein referred to as a logic element. Some logic elements are implemented as combinations of look up tables and switches for performing Boolean operations on input lines. In one example, a logic element includes a 16-bit SRAM lookup table (LUT) that can implement an arbitrary 4-input logic function, circuitry that forms a fast carry chain and a fast cascade chain, a register and preset/reset logic for the register.

According to various embodiments, each processor element includes multiplier blocks and adder/output blocks. The multiplier block includes input registers, a multiplier, and a pipeline register for pipelining multiply-accumulate and multiply-add/subtract functions.

Figure 2:
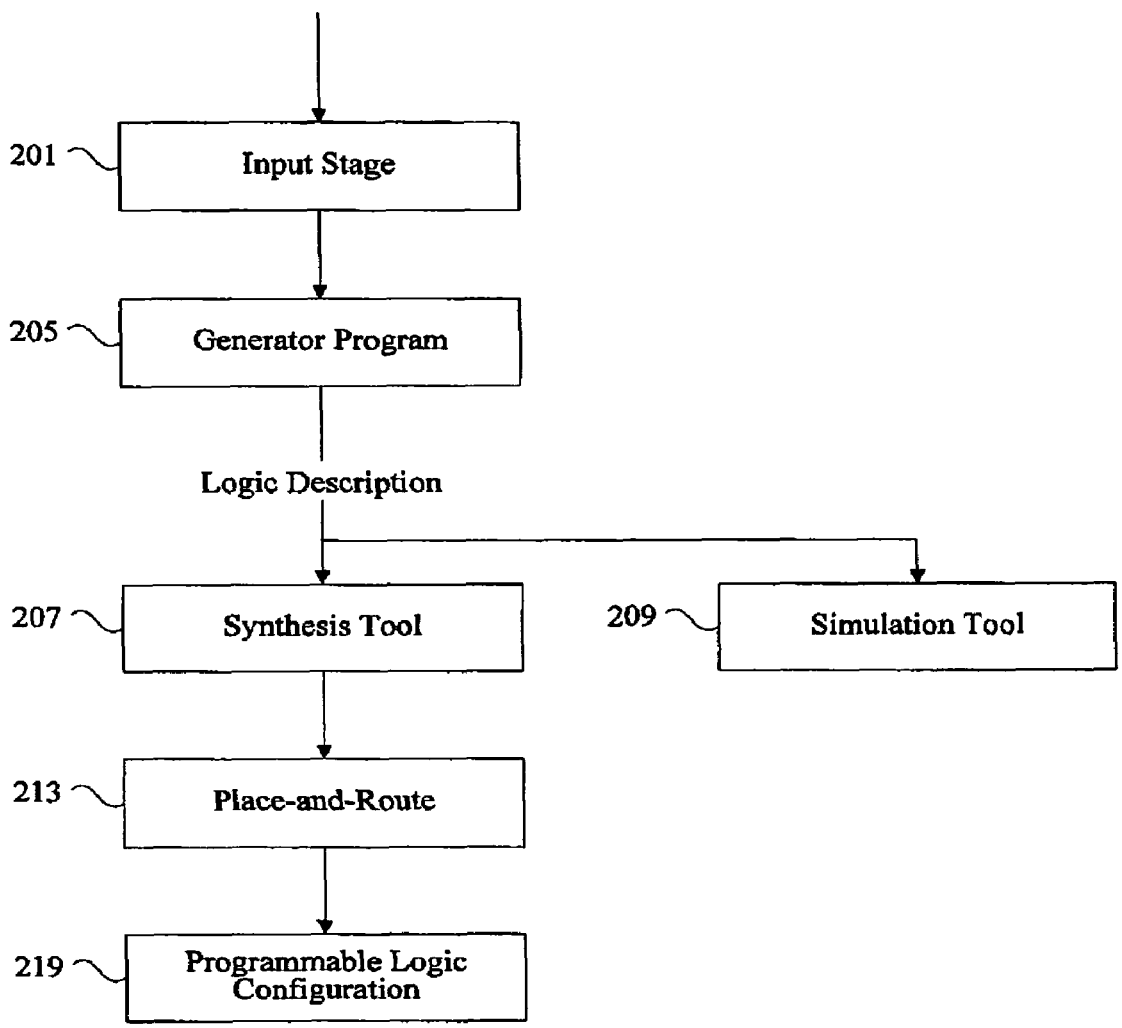
FIG. 2 is a diagrammatic representation showing the programming of the target device.

FIG. 2 is a diagrammatic representation of one example of the various programs, tools, and stages that are commonly used to implement a programmable chip. An input stage 201 receives selection information typically from a user for logic such as a processor as well as other components to be implemented on a programmable chip. A generator program 205 creates a logic description provides the logic description along with other customized logic to any of a variety of synthesis tools, place and route programs, and programmable logic configuration tools to allow a logic description to be downloaded onto the programmable chip.

In one example, an input stage 201 typically allows selection and parameterization of components to be used with customized logic. In some examples, components provided to an input stage include intellectual property functions, megafunctions, and intellectual property cores. The input stage 201 may be a graphical user interface using wizards for allowing efficient or convenient entry of information. The input stage may also be a text interface or a program reading a data file such as a spreadsheet, database table, or schematic to acquire selection information. The input stage 201 produces an output containing information about the various modules selected.

Intellectual property functions have conventionally encapsulated a single implementation for the specified function. Designers would have to select general processor cores to implement specific functions with logic elements. In some instances, a general processor core would have some configurable parameters. In one instance, an 8-bit processor versus a 16-bit processor could be selected based on the needs of the application and the availability of resources.

In typical implementations, the generator program 205 can identify the selections and generate a logic description with information for implementing the various modules. The generator program 205 can be a Perl script creating HDL files such as Verilog, Abel, VHDL, and AHDL files from the module information entered by a user. According to various embodiments, the generator program 205 also provides information to a synthesis tool 207 to allow HDL files to be automatically synthesized. In some examples, a logic description is provided directly by a designer. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool 209.

As will be appreciated by one of skill in the art, the input stage 201, generator program 205, and synthesis tool 207 can be separate programs. The interface between the separate programs can be a database file, a log, or simply messages transmitted between the programs. For example, instead of writing a file to storage, the input stage 201 can send messages directly to the generator program 205 to allow the generator program to create a logic description. Similarly, the generator program can provide information directly to the synthesis tool instead of writing HDL files. Similarly, input stage 201, generator program 205, and synthesis tool 207 can be integrated into a single program.

A user may select various modules and an integrated program can then take the user selections and output a logic description in the form of a synthesized netlist without intermediate files. Any mechanism for depicting the logic to be programmed onto a programmable chip is referred to herein as a logic description. According to various embodiments, a logic description is an HDL file such as a VHDL, Abel, AHDL, or Verilog file. A logic description may be in various stages of processing between the user selection of components and parameters to the final configuration of the programmable chip. According to other embodiments, a logic description is a synthesized netlist such as an Electronic Design Interchange Format Input File (EDF file). An EDF file is one example of a synthesized netlist file that can be output by the synthesis tool 207.

A synthesis tool 207 can take HDL files and output EDF files. Various synthesized netlist formats will be appreciated by one of skill in the art. The synthesized netlist file can be read by a place and route tool 213. A place and route tool typically locates logic cells onto specific logic elements of a target hardware device and connects wires between the inputs and outputs of the various logic elements in accordance with logic required to implement an electronic design. A programmable logic configuration stage 219 can take the output of the place and route tool to program the logic device with the user selected and parameterized modules. According to various embodiments, the place and route tool 213 and the programmable logic configuration stage 219 are provided in the Quartus Development Tool, available from Altera Corporation of San Jose, Calif. As will be appreciated by one of skill in the art, a variety of synthesis, place and route, and programmable logic configuration tools can be used to implement various techniques of the present invention.

As noted above, different stages and programs can be integrated in a variety of manners. According to one embodiment, the input stage 201, the generator program 205, the synthesis tool 207, the place and route tool 213, and the programmable logic configuration stage 219 are integrated into a single program. The various stages are automatically run and transparent to a user. The program can receive the user selected modules, generate an logic description depicting logic for implementing the various selected modules, and implement the programmable chip. As will be appreciated by one of skill in the art, HDL files and EDF files are mere examples of a logic description. Other file formats as well as internal program representations are other examples of a logic description.

Figure 3:
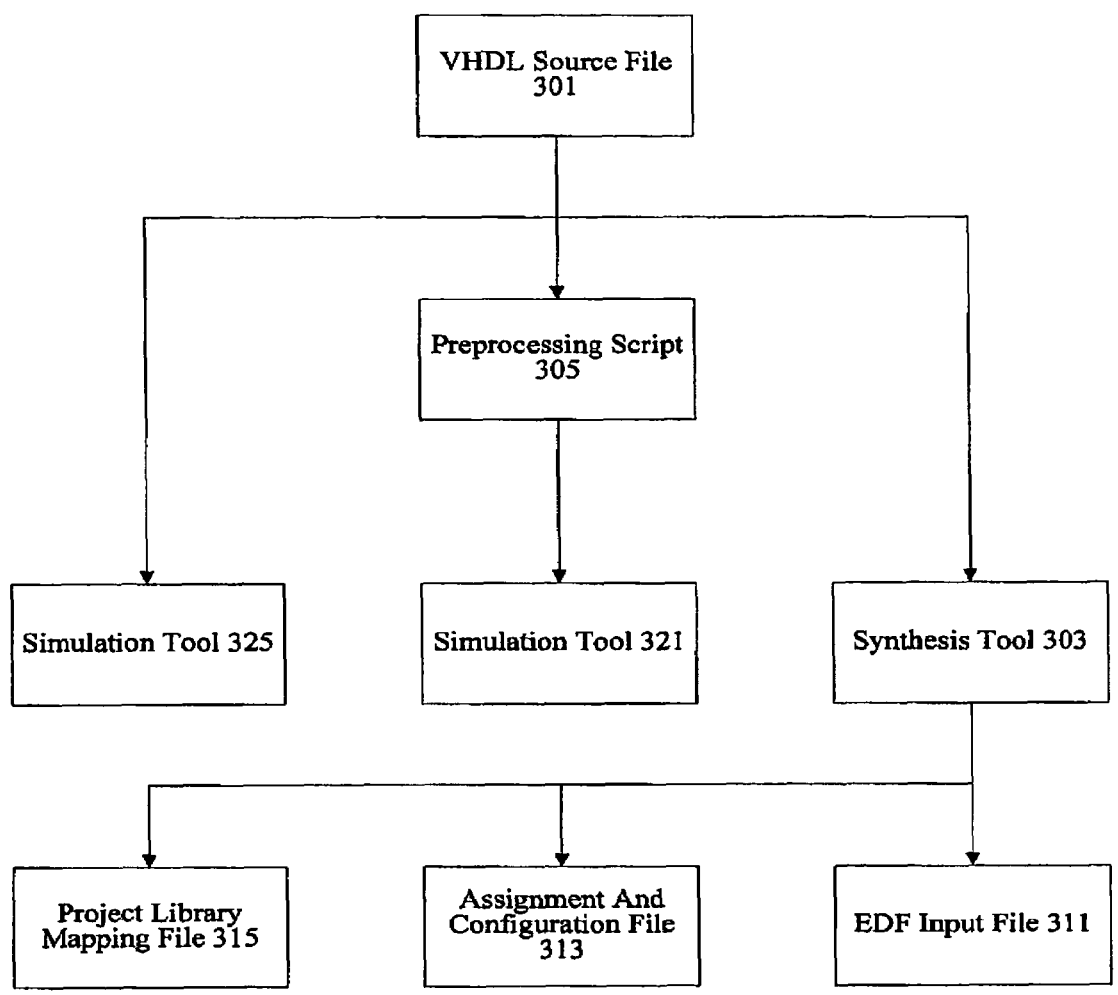
FIG. 3 is a diagrammatic representation showing hardware description language processing.

FIG. 3 is a diagrammatic representation showing more detailed processing associated with synthesis and simulation tools. According to various embodiments, an HDL design file such as a VHDL source file 301 is provided for both logic synthesis and simulation. The VHDL source file 301 may be provided to a synthesis tool 303, simulation software 321, and simulation software 325. In one example, simulation software 325 is capable of reading the VHDL source file 301. However, simulation software 321 is not. Consequently, VHDL source file 301 is passed to a preprocessing script 305 that is configured to convert the VHDL source file 301 into a form recognizable by simulation tool 321. In one instance, the preprocessing script 305 removes material that simulation tool 321 can not recognize. In another example, the preprocessing script 305 creates simulation models for various synthesis tool-specific portions of the VHDL source file 301.

The synthesis tool 303 takes the VHDL source file 301 and generates output information such as EDF files files 311 for implementing the design on the programmable chip. It should be noted that the synthesis tool 303 may also output other files such as assignment and configuration (ACF) files 313, as well as project library mapping (LMF) files 315. Tool-specific code creates complications during the synthesis and simulation process by introducing the possible need for various preprocessing scripts to account for incompatabilities.

FIG. 4 is a diagrammatic representation showing a commonly used technique for allowing the handling of simulation tool-specific code. In many hardware description languages, comment indicators are used to indicate to a tool to disregard portions of a source file. Indicators noting that portions should be read as comments are referred to herein as comment indicator information. Some comment indicators include // and -- used to signify that the remaining portion of the line before the end of line or carriage return character should be read as comments. Other comment indicators include beginning comment indicators such as /* and end comment indicators such as */ to signify that portions of code between the indicators should be read as comments. Conventional simulation tools and synthesis tools recognize the comment indicators.

Comment indicators can be used to handle simulation tool-specific code. In one example, a comment indicator 401, such as a -- character sequence, is used to indicate that a particular line should be read as comments. However, instructions can be provided within the comments in a format recognizable to a tool. In one example, a comment indicator 401 precedes a vendor code 405 directing a particular tool associated with the vendor to ignore subsequent code until it reads further instructions 423 associated with another comment indicator 421 and vendor code 425. One example is as follows:

-- synthesis_tool_vendor translate_off
use std.textio.all;
-- synthesis_tool_vendor translate_on The -- character sequence followed by the translate_off insruction directs the synthesis tool to ignore all code until it receives a translate_on instruction. The next line of code (use std.textio.all), is consequently ignored. In one example, the translate_off and translate_on mechanism provides a convenient way for logic designers to provide simulation tool-specific code in a VHDL source file. A simulation tool reading the code line (use std.textio.all) would simply parse and process the code as any simulation tool would and ignore the comments. However, a specially configured synthesis tool would recognize instructions embedded in the comments and ignore the code line (use std.textio.all). Many synthesis tools have been modified to look for instructions or directives in comment lines. The instructions or directives may or may not be associated with a particular vendor code. Directives are provided in synthesis tools such as Leonardo Spectrum, available from Mentor Graphics Corporation of Wilsonville, Oreg. and Synplify available from Synplicity Corporation of Sunnyvale, Calif. Consequently, a modification to the synthesis tool allows simulation tool-specific code to be read by both a synthesis tool and a simulation tool without requiring any preprocessing scripts.

Simulation tools, however, have not been configured to read and understand directives. That is, simulation tools do not recognize any instructions directing the simulation tools not to parse and process a particular block of code. A simulation tool, in one example, could be modified to recognize the following sequence:

-- simulation_tool_vendor translate_off
my_rom lpm_rom (.address (address),.data (data));
-- simulation_tool_vendor translate_on A synthesis tool reading the above code would recognize that the instruction was not directed at it and consequently would parse and process the line of code (my_rom lpm_rom (.address (address),.data (data))). A simulation tool, however, would recognize that an instruction was being provided to not parse and process the block of code. Consequently, synthesis tool-specific code could be passed to the simulation tool without any preprocessing. However, no such mechanisms have been generally available in simulation tools and simulation tools generally do not support directives.

The techniques of the present invention recognize that synthesis tool-specific code and simulation tool-specific code can be handled by making modifications to only a synthesis tool. Consequently, no simulation tools need to be modified. FIG. 4 described a technique for handling simulation tool-specific code by using instructions within comments. A synthesis tool would read an instruction to ignore a specified code portion while a simulation tool would simply parse and process the code portion.

FIG. 5 shows a mechanism for handling synthesis tool-specific code. According to various embodiments, synthesis tool-specific code can be handled without making any modifications to the simulation tool. A comment indicator 501 is followed by a vendor code 505 and an instruction 503. The instruction 503 precedes another comment indicator 511 associated with a line of code 513. The instruction 503 here directs the synthesis tool to ignore any comment indicators until an end instruction is read. Consequently, comments are parsed and processed as code. Any instruction directing a tool to disregard subsequent comment indicators is referred to herein as exception indicator information. In one example, exception indicator information 503 may be an instruction such as read_comment_as_hdl. Comment 513 delinated by comment indicator 511 would be read as HDL code. Multiple lines of comments may be read as HDL code before an end exception 525 is received. One example of code is as follows:

-- synthesis_tool_vendor read_comment_as_hdl_on
-- my_rom lpm_rom (.address (address),.data (data));
-- synthesis_tool_vendor read_comment_as_hdl_off Having source code in a comment indicator delineated portion allows a simulation tool to simply ignore all provided synthesis tool-specific code. A synthesis tool, however, would parse and process the synthesis tool-specific code based upon the instruction to read the comment as HDL.

A variety of mechanisms can be used to handle error conditions such as nested comments or multiple consecutive begin instructions or multiple consecutive end instructions. In one example, nested comments may not be supported and multiple consecutive begin or end instructions may be ignored. Instruction formats may also vary. In one case, instructions may be followed by toggles or on/off indicators.

Figure 6:
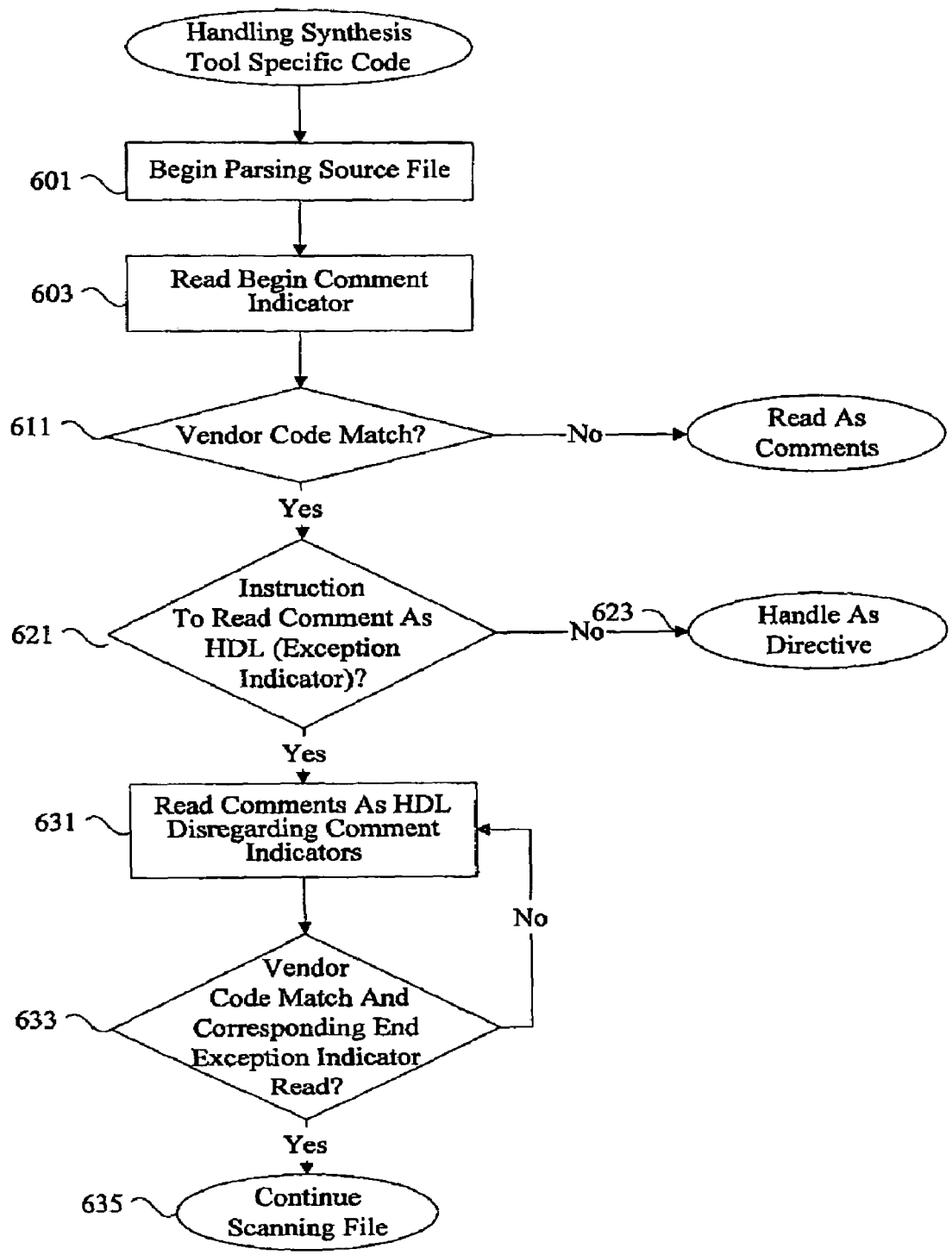
FIG. 6 is a flow process diagram showing one example of an improved technique for logic synthesis and simulation.

FIG. 6 is a flow process diagram showing the handling of synthesis tool-specific code in a synthesis tool. At 601, a source file is parsed. During parsing, a begin comment indicators such as a //, --, or /* is read at 603. At 611, it is determined if there is a vendor code match. If the character sequence following the begin comment indicator does not match the vendor code of the synthesis tool, subsequent comments are read as comments. In typical cases of // or -- begin comment indicators, the rest of the line is read as comments. In typical cases of the /* begin comment indicator, the code between the /* and the subsequent */ is read as comments. If there is a vendor code match at 611, it is determined at 621 if there is a exception indicator or an instruction to read the comment not as a comment, but as HDL. If there is not, the instruction is handled as a directive at 623. If an exception indicator is present, comments are read as HDL while comment indicators are disregarded at 631. Comments are read as HDL until another vendor code match and corresponding end exception indicators is read at 633. When the end exception indicator is read at 633, parsing continues to proceed at 635.

Figure 7:
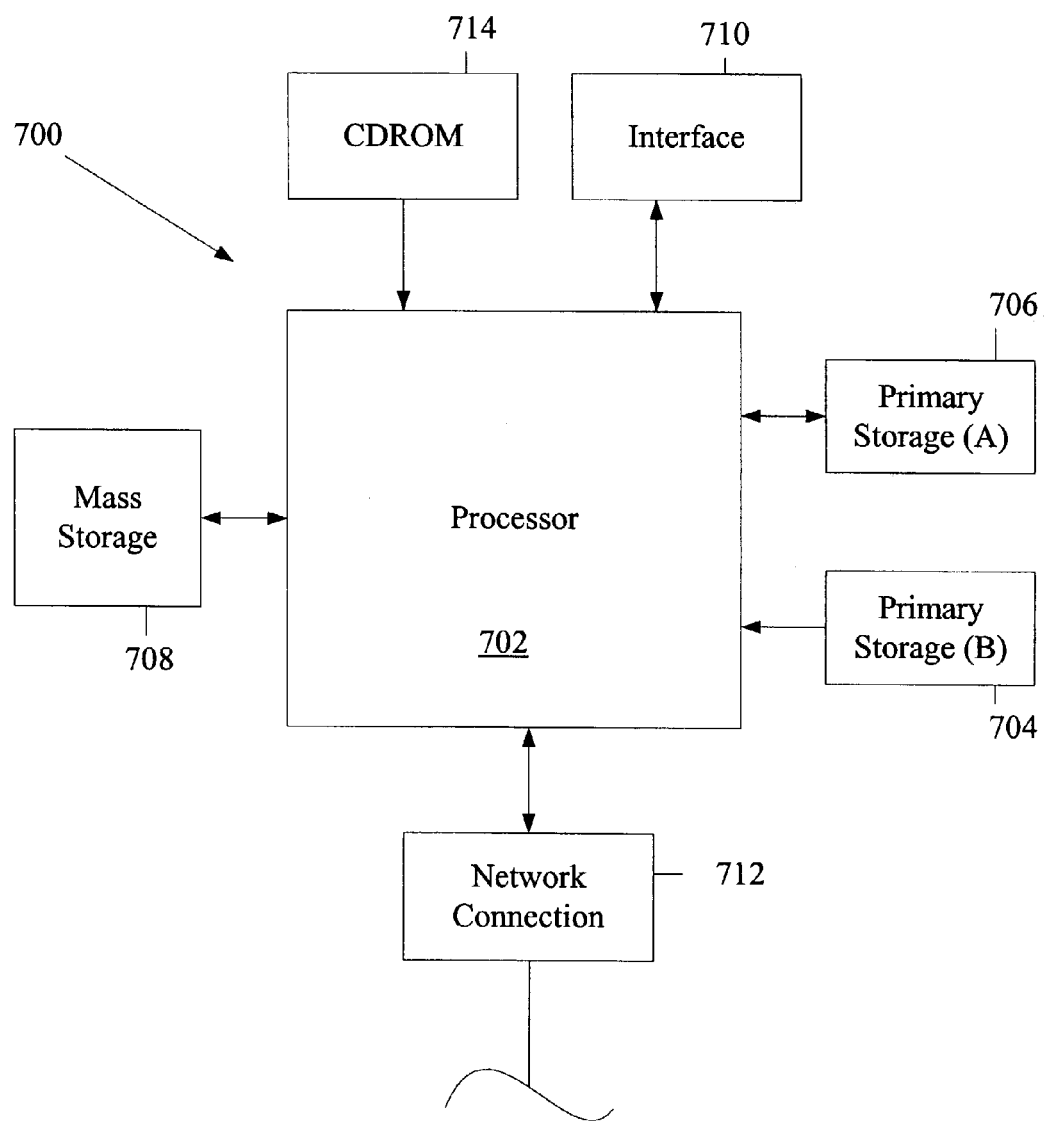
FIG. 7 is a diagrammatic representation of a system for configuring the target device.

The techniques of the present invention for allowing tool-specific code processing by multiple tools can be implemented on a variety of system. FIG. 7 illustrates a typical computer system that can be used to implement a programmable chip in accordance with an embodiment of the present invention. The computer system 700 includes any number of processors 702 (also referred to as central processing units, or CPUs) that are coupled to storage devices including primary storage 706 (typically a random access memory, or "RAM"), primary storage 704 (typically a read only memory, or "ROM"). The processors 702 can be configured to receive selection information from a user to dynamically generate a logic description. As is well known in the art, primary storage 704 acts to transfer data and instructions uni-directionally to the CPU and primary storage 706 is used typically to transfer data and instructions in a bi-directional manner.

Both of these primary storage devices may include any suitable type of the computer-readable media described above. A mass storage device 708 is also coupled bi-directionally to CPU 702 and provides additional data storage capacity and may include any of the computer-readable media described above. The mass storage device 708 may be used to store programs, data and the like and is typically a secondary storage medium such as a hard disk that is slower than primary storage. The mass storage device 708 can be used to hold a library or database of prepackaged logic or intellectual property functions, as well as information on generating particular configurations. It will be appreciated that the information retained within the mass storage device 708, may, in appropriate cases, be incorporated in standard fashion as part of primary storage 706 as virtual memory. A specific mass storage device such as a CD-ROM 714 may also pass data uni-directionally to the CPU.

CPU 702 is also coupled to an interface 710 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Video monitors can be used to display wizards and subwizards to a user. Finally, CPU 702 optionally may be coupled to a computer or telecommunications network using a network connection as shown generally at 712. With such a network connection, it is contemplated that the CPU might receive information from the network, or might output information to the network in the course of performing the above-described method steps. It should be noted that the system 700 may also be associated with devices for transferring completed designs onto a programmable chip. The above-described devices and materials will be familiar to those of skill in the computer hardware and software arts.

The hardware elements described above may be configured (usually temporarily) to act as multiple software modules for performing the operations of this invention. For example, instructions for running a generator program, input stage (e.g., a wizard), and/or compiler may be stored on mass storage device 708 or 714 and executed on CPU 708 in conjunction with primary memory 706.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, various aspects described above may be implemented using firmware, software, or hardware. Aspects of the present invention may be employed with a variety of different file formats, languages, and communication protocols and should not be restricted to the ones mentioned above. In one example, the techniques of the present invention could be applied to any software parser. Mechanisms allow for additional special code to be passed exclusively to a particular vendor's compiler.

Furthermore, the techniques of the present invention have been described with reference to changes in a synthesis tool to allow support for tool-specific code without making changes to a simulation tool. It is recognized that similar changes can be made to a simulation tool to allow support for tool-specific code without making changes to a synthesis tool. Instructions can be provided in comment portions to instruct a simulation tool to disregard code or to read comments as code. Therefore, the scope of the invention should be determined with reference to the appended claims.

What is claimed is:

1. A method for parsing code, the method comprising:
receiving a source file at a logic synthesis tool;
initiating a scan of the source file, the source file including logic information for implementing a programmable chip;
identifying comment indicator information included in the source file, the comment indicator information directing the logic synthesis tool to disregard a first portion of the source file as comment information;
identifying exception indicator information included in the first portion, the exception indicator noting that a second portion of the source file included in the first portion is not comment information;
parsing the second portion.

2. The method of claim 1, wherein the second portion is parsed to provide information for implementing the programmable chip.

3. The method of claim 1, wherein the second portion of text is parsed for logic synthesis or simulation.

4. The method of claim 3, wherein the second portion of text identifies memory objects.

5. The method of claim 1, further comprising forwarding the source file to a simulation tool, wherein the simulation tool disregards both the first portion and the second portion as comment information.

6. The method of claim 1, wherein the second portion is bounded by a begin exception indicator and an end exception indicator.

7. The method of claim 6, wherein the begin exception indicator and the end exception indicator each include a vendor and a directive.

8. The method of claim 7, wherein the directive is interpreted as an instruction by the logic synthesis tool.

9. The method of claim 1, wherein the comment indicator information includes a first begin comment indicator, wherein the logic synthesis tool ignores a subsequent begin comment indicator following the first begin comment indicator without an intervening end comment indicator.

10. The method of claim 1, wherein the comment indicator information includes a first end comment indicator, wherein the logic synthesis tool ignores a subsequent end comment indicator following the first end comment indicator without an intervening begin comment indicator.

11. The method of claim 1, wherein the first portion is bounded by a begin comment indicator and an end comment indicator.

12. The method of claim 11, wherein the begin comment indicator is a pair of forward slashes.

13. The method of claim 12, wherein the end comment indicator is an end of line indicator.

14. The method of claim 12, wherein the begin comment indicator is a forward slash followed by an asterisk.

15. The method of claim 14, wherein the end comment indicator is an asterisk followed by a forward slash.

16. The method of claim 11, wherein the begin comment indicator is a pair of dashes.

17. A computer readable medium including computer code for implementing a programmable chip, the computer readable medium comprising:
comment indicator information, the comment indicator information directing a logic synthesis tool to disregard a first portion of a source file associated with the computer readable medium as comment information;
exception indicator information included in the first portion, the exception indicator noting that a second portion of the source file included in the first portion is not comment information;
logic description information included in the second portion providing information on implementing the programmable chip.

18. The computer readable medium of claim 17, wherein the logic description information includes information for implementing a processor core.

19. The computer readable medium of claim 18, wherein the source file is an HDL source file.

20. The computer readable medium of claim 17, wherein the second portion is parsed for logic synthesis or simulation.

21. The computer readable medium of claim 20, wherein the second portion identifies memory objects.

22. The computer readable medium of claim 17, wherein the second portion is bounded by a begin exception indicator and an end exception indicator.

23. The computer readable medium of claim 22, wherein the begin exception indicator and the end exception indicator each include a vendor and a directive.

24. The computer readable medium of claim 23, wherein the directive is interpreted as an instruction by the logic synthesis tool.

25. A system for implementing a programmable chip, the system comprising:
an interface configured to receive a source file including logic information for implementing a programmable chip;
memory;
a processor coupled to said memory, the processor configured to initiate a scan of the source file and identify comment indicator information and exception indicator information, wherein the comment indicator information designating a first portion of the source file as comment information and the exception indicator information included in the first portion designates that a second portion of the source file is not comment information.

26. The system of claim 25, wherein the second portion is parsed to provide information for implementing the programmable chip.

27. The system of claim 25, wherein the second portion is parsed for logic synthesis or simulation.

28. A system for parsing code, the system comprising:
means for receiving a source file at a logic synthesis tool;
means for initiating a scan of the source file, the source file including logic information for implementing a programmable chip;
means for identifying comment indicator information included in the source file, the comment indicator information directing the logic synthesis tool to disregard a first portion of the source file as comment information;
means for identifying exception indicator information included in the first portion, the exception indicator noting that a second portion of the source file included in the first portion is not comment information;
means for parsing the second portion.

29. The system of claim 28, wherein the second portion is parsed to provide information for implementing the programmable chip.

30. The system of claim 29, wherein the source file is an HDL source file.

31. The system of claim 28, wherein the second portion is parsed for logic synthesis or simulation.

* * * * *